United States Patent
Kudo et al.

(10) Patent No.: US 6,800,416 B2
(45) Date of Patent: Oct. 5, 2004

(54) NEGATIVE DEEP ULTRAVIOLET PHOTORESIST

(75) Inventors: Takanori Kudo, Bedminster, NJ (US); Munirathna Padmanaban, Bridgewater, NJ (US); Ralph R. Dammel, Flemington, NJ (US); Medhat A. Touky, Flemington, NJ (US)

(73) Assignee: Clariant Finance (BVI) Ltd., Tortola (VG)

( * ) Notice: Subject to any disclaimer, the term of this patent is extended or adjusted under 35 U.S.C. 154(b) by 88 days.

(21) Appl. No.: 10/042,531

(22) Filed: Jan. 9, 2002

(65) Prior Publication Data

US 2003/0129527 A1 Jul. 10, 2003

(51) Int. Cl.⁷ .............................................. G03F 7/004
(52) U.S. Cl. ..................... 430/270.1; 430/325; 430/907
(58) Field of Search ............................. 430/270.1, 325, 430/907

(56) References Cited

U.S. PATENT DOCUMENTS

| | | |
|---|---|---|
| 4,491,628 A | 1/1985 | Ito et al. |
| 5,350,660 A | 9/1994 | Urano et al. |
| 5,843,624 A | 12/1998 | Houlihan et al. |
| 6,472,130 B1 * | 10/2002 | Geyer et al. ............... 430/331 |
| 6,548,219 B2 * | 4/2003 | Ito et al. ................... 430/270.1 |
| 2002/0058197 A1 * | 5/2002 | Nozaki et al. |

FOREIGN PATENT DOCUMENTS

| | | |
|---|---|---|
| EP | 789278 | 2/1997 |
| EP | WO 00/17712 | 9/1999 |
| EP | WO 00/67072 | 4/2000 |
| EP | WO 02 093263 A1 | 11/2002 |
| GB | 2320718 | 12/1997 |

OTHER PUBLICATIONS

Cho, S. et al. SPIE 2000 3999 62–73.*
Hiroshi Ito et al, "Polymer design for 157 nm chemically amplified resists", SPIE vol. 4345, 2001, pp. 273–284.
Minoru Toriumi, "Resist materials for 157–nm lithography", SPIE vol. 4345, 2001, pp. 371–378.
Przybilla et al, "Hexafluoroacetone in Resist Chemistry: A Versatile New Concept for Materials for Deep UV Lithography", SPIE, vol. 1672, 1992, p. 500–512.
Padmanaban et al, XP–008014024, "Materials and Resists for 193 and 157 nm Applications", Journal of Photopolymer Science and Technology, Chiba, JP, vol. 14, No. 4, 2001, pp. 631–642.

* cited by examiner

*Primary Examiner*—Rosemary E Ashton
(74) *Attorney, Agent, or Firm*—Sangya Jain

(57) ABSTRACT

The present invention relates to a novel negative working deep uv photoresist that is developable in an aqueous alkaline solution, and comprises a fluorinated polymer, photoactive compound and a crosslinking agent. The photoresist composition is particularly useful for patterning with exposure wavelengths of 193 nm and 157 nm.

9 Claims, No Drawings

NEGATIVE DEEP ULTRAVIOLET PHOTORESIST

FIELD OF INVENTION

The present invention relates to a novel negative-working deep ultraviolet (UV) photoresist comprising a polymer, photoacid generator and a crosslinking agent. The photoresist is particularly useful for imaging with exposure wavelengths of 193 nanometers (nm) and 157 nm. The invention also relates to a process for imaging the novel photoresist.

BACKGROUND OF THE INVENTION

Photoresist compositions are used in microlithographic processes for making miniaturized electronic components such as in the fabrication of computer chips and integrated circuits. Generally, in these processes, a thin film of a photoresist composition is first applied to a substrate material, such as silicon wafers used for making integrated circuits. The coated substrate is then baked to evaporate solvent in the photoresist composition and to fix the coating onto the substrate. The baked, coated surface of the substrate is next subjected to an image-wise exposure to imaging radiation.

This radiation exposure causes a chemical transformation in the exposed areas of the coated surface. Visible light, ultraviolet (UV) light, electron beam and X-ray radiant energy are imaging radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the photoresist composition exposed to the radiation become less soluble to a developer solution (e.g. a cross-linking reaction occurs) while the unexposed areas of the photoresist coating remain relatively soluble to such a solution. Thus, treatment of an exposed negative-working photoresist with a developer causes removal of the non-exposed areas of the photoresist coating and the creation of a negative image in the coating, thereby uncovering a desired portion of the underlying substrate surface on which the photoresist composition was deposited. In a positive-working photoresist the developer removes the portions that are exposed. During the manufacture of devices it is sometimes desirable to use negative-acting photoresists to form images on a substrate.

Photoresist resolution is defined as the smallest feature which the photo composition can transfer from the photomask to the substrate with a high degree of image edge acuity after exposure and development. In many leading edge manufacturing applications today, photoresist resolution on the order of less than one-half micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the drive toward miniaturization reduces the critical dimensions on the devices.

Photoresists sensitive to short wavelengths, between about 100 nm and about 300 nm are often used where subhalfmicron geometries are required. High resolution, chemically amplified, deep ultraviolet (100–300 nm) positive and negative tone photoresists are available for patterning images with less than quarter micron geometries. To date, there are three major deep ultraviolet (uv) exposure technologies that have provided significant advancement in miniaturization, and these use lasers that emit radiation at 248 nm, 193 nm and 157 nm. Photoresists for 248 nm have typically been based on substituted polyhydroxystyrene and its copolymers, such as those described in U.S. Pat. Nos. 4,491,628 and 5,350,660. On the other hand, photoresists for 193 nm exposure require non-aromatic polymers, since aromatics are opaque at this wavelength. U.S. Pat. No 5,843,624 and GB 232,0718 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon:hydrogen ratios which improve etch resistance, they also provide transparency at low wavelengths and they have relatively high glass transition temperatures.

The use of a negative-working, acid-sensitive photoresist composition is known in the prior art. Typically a negative photoresist comprises an alkali-soluble polymer, a photoacid generator and a crosslinking agent. Most of the prior art photoresist compositions use a polymeric binder that is aromatic, such polymers being novolaks or polyhyroxystyrenes. Aromatic polymers, although possessing good dry etch resistance, do not have desirable transparency at wavelengths below 200 nm. Thus there is a need for a negative acting photoresist that is transparent at exposure wavelengths below 200 nm, particularly below 160 nm, and also having good dry etch resistance.

Fluorinated polymers are known for being transparent at 193 nm and 157 nm. Such polymers when used in a photoresist are disclosed in EP 789,278, Ito et al (SPIE Proceedings, Vol. 4345, 2001, pages 273–284), WO 00/67072 and WO 00/17712. WO 00/67072 specifically discloses nonaromatic, alicyclic polymers with pendant fluorinated groups. One such polymer is derived from the polymerization of a norbornene monomer with a pendant —$(R_f)(R_{f'})OR_b$ group, where $R_f$ and $R_{f'}$ are fluoroalkyl groups and $R_b$ is hydrogen or acid-labile group. This polymer is processed with a photoactive compound to give a positive photoresist image. Similarly, Ito describes the possibility of using an all norbornene polymer with pendant hexafluoro-2-hydroxyisopropyl group substituted with an acid labile group to form positive images. Toriumi et al (SPIE Proceedings, Vol. 4345, 2001, pages 371–378) describes a negative photoresist using a fluoropolymer, triphenylsulfonium triflate and a hydroxymethyl compound as a crosslinker, where the photoresist has a sensitivity for a gel dose of 200 mJ/cm$^2$. The structure of the fluoropolymer is not disclosed. Hexafluoro-2-hydroxy-isopropyl groups pendant from styrenic polymers and their use in negative photoresists are described by Przybilla (SPIE Proceedings, Vol. 1672, 1992, pages 500–512). However since these polymers contain aromatic groups they are not useful for imaging at wavelengths below 200 nm.

Thus, there is a need in the semiconductor industry for a negative-acting photoresist that can provide good lithographic properties when imaged at below 200 nm, especially having good bleaching characteristics and good photosensitivity.

SUMMARY OF THE INVENTION

The invention pertains to a novel negative-working photoresist that can be developed with an aqueous alkaline solution, and is capable of being imaged at exposure wavelengths below 200 nm. The invention also relates to a process for imaging the novel photoresist. The novel photoresist comprises an alkali soluble fluorinated polymer, a photoacid generator and a crosslinking agent. The polymer has at least one unit of structure 1,

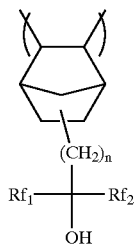

(1)

where $Rf_1$ and $Rf_2$ are independently a perfluorinated or partially fluorinated ($C_1$–$C_4$) alkyl group; and n is 1–8.

DESCRIPTION OF THE INVENTION

The present invention relates to a novel negative-working photoresist that can be developed with an aqueous alkaline solution, and is capable of being imaged at exposure wavelengths below 200 nm. The invention also relates to a process for imaging the novel photoresist. The novel photoresist comprises an alkali soluble fluorinated polymer, a photoactive compound and a crosslinking agent. The polymer has at least one unit of structure 1,

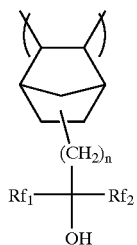

(1)

where $Rf_1$ and $Rf_2$ are independently a perfluorinated or partially fluorinated ($C_1$–$C_4$) alkyl group; and n is 1–8. Preferably $Rf_1$ and $Rf_2$ are both $CF_3$, and more preferably n is 1.

The pendant fluoroalkyl-2-hydroxy-alkylene group imparts the alkaline solubility necessary to make the polymer soluble in an aqueous alkaline developer. The polymer may be a homopolymer of the unit of structure 1 or may contain other units that are not aromatic. Examples of other comonomers may be tetrafluoroethylene, ethylene, cycloalkenes, substituted cycloalkenes such as norbornene and it derivatives, maleic anhydride, cyanoacrylate and cyanomethacrylate. Preferably the polymer is a homopolymer, more preferably the polymer is poly[5-(2-trifluoromethyl-1,1,1-trifluoro-2-hydroxypropyl)-2-norbornene].

Polymers synthesized from cycloolefins, such as norbornene and tetracyclododecene derivatives, may be polymerized by ring-opening metathesis, free-radical polymerization or using metal organic catalysts. The novel polymer of this invention is polymerized to give a polymer with a weight average molecular weight from about 1,000 to about 200,000, preferably from about 4,000 to about 20,000, more preferably from about 6,000 to about 14,000. The polydispersity of the resin (Mw/Mn) where Mw is the weight average molecular weight and Mn is the number average molecular weight can range from 1.5 to 3.0, where the molecular weights of the resin may be determined by gel permeation chromatography, The photoresist composition comprises at least one photosensitive compound which when exposed to radiation forms either an acid or a base, although an acid is most commonly used. In positive photoresists the generation of the acid typically deprotects the polymer, such that the photoresist becomes soluble in the exposed areas. The acid can alternatively cause the polymer to crosslink such that the photoresist becomes insoluble in the exposed areas, and such a photoresist is known as a negative photoresist. Any photoactive compound or mixtures of photoactive compounds may be used in the novel photoresist. Suitable examples of the acid generating photosensitive compounds include ionic photoacid generators (PAG), such as diazonium salts, iodonium salts, sulfonium salts, or non-ionic PAGs such as diazosulfonyl compounds, sulfonyloxy imides, and nitrobenzyl sulfonate esters, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluromethane sulfonate, triphenylsulfonium nonafluorobutane sulfonate and the like. Other compounds that form an acid upon irradiation which may be used, are triazines, oxazoles, oxadiazoles, thiazoles, substituted 2-pyrones. Phenolic sulfonic esters, bis-sulfonylmethanes, bis-sulfonylmethanes or bis-sulfonyidiazomethanes, triphenylsulfonium tris(trifluoromethylsulfonyl)methide, triphenylsulfonium bis(trifluoromethylsulfonyl)imide, diphenyliodonium tris(trifluoromethylsulfonyl)methide, diphenyliodonium bis(trifluoromethylsulfonyl)imide and their homologues are also preferred. Mixtures of photoacid generators may also be used, and frequently mixtures of ionic and nonionic photoacid generators are used.

A variety of crosslinking agents can be used in the composition of the present invention. Any suitable crosslinking agent that can crosslink the polymer in the presence of an acid may be used. Examples of such crosslinking agents are melamines, methylols, glycolurils, hydroxy alkyl amides, epoxy and epoxy amine resins, blocked isocyanates, and divinyl monomers. Melamines like hexamethoxymethyl melamine and hexabutoxymethylmelamine; glycolurils like tetra(methoxymethyl)glycoluril and tetra(butoxymethyl)glycoluril; and aromatic methylols, like 2,6-bis(hydroxymethyl)-p-cresol are preferred. Other crosslinkers are tertiary diols such as 2,5-dimethyl-2,5-hexanediol, 2,4-dimethyl-2,4-pentanediol, pinacol, 1-methylcyclohexanol, tetramethyl-1,3-benzenedimethanol, and tetramethyl-1,4-benzenedimethanol, and polyphenols, such as tetramethyl-1,3-benzenedimethanol.

Various other additives such as colorants, non-actinic dyes, anti-striation agents, plasticizers, adhesion promoters, coating aids, speed enhancers and surfactants may be added to the photoresist composition before the solution is coated onto a substrate. A sensitizer that transfers energy from a particular range of wavelengths to a different exposure wavelength may also be added to the photoresist composition. Often bases are also added to the photoresist to prevent t-tops at the surface of the image. Examples of bases are amines, ammonium hydroxide, and photosensitive bases. Particularly preferred bases are tetrabutylammonium hydroxide, triethanolamine, diethanol amine, trioctylamine, n-octylamine, trimethylsulfonium hydroxide, triphenylsulfonium hydroxide, bis(t-butylphenyl)iodonium cyclamate and tris(tert-butylphenyl)sulfonium cyclamate.

Typical photoresist compositions of the present invention may comprise up to about 50 percent by weight of the solids, based on the total weight of the photoresist composition. The solids may comprise from 1 to 15 weight percent of the photoacid generator, 40 to 80 weight percent of polymer and from 5 to 30 weight percent of the crosslinking agents, based on the total solids content of the photoresist composition.

The solid components are dissolved in a solvent. Suitable solvents for such photoresist compositions may include propylene glycol mono-alkyl ether, propylene glycol alkyl (e.g. methyl) ether acetate, 2-heptanone, 3-methoxy-3-methyl butanol, butyl acetate, anisole, xylene, diglyme, ethylene glycol monoethyl ether acetate, ethylene glycol monomethyl ether, ethylene glycol monoethyl ether, diethylene glycol monoethyl ether, ethylene glycol monoethyl ether acetate, ethylene glycol monomethyl acetate, methyl ethyl ketone, a monooxymonocarboxylic acid ester, such as methyl oxyacetate, ethyl oxyacetate, butyl oxyacetate, methyl methoxyacetate, ethyl methoxyacetate, butyl methoxyacetate, methyl ethoxyactetate, ethyl ethoxyacetate, ethoxy ethyl propionate, methyl 3-oxypropionate, ethyl 3-oxypropionate, methyl 3-methoxypropionate, ethyl 3-methoxypropionate, methyl 2-oxypropionate, ethyl 2-oxypropionate, ethyl 2-hydroxypropionate (ethyl lactate), ethyl 3-hydroxypropionate, propyl 2-oxypropionate, methyl 2-ethoxypropionate, or propyl 2-methoxy propionate, or mixtures of one or more of these solvents. Solvents, of course, are substantially removed after coating of the photoresist solution on a substrate and subsequent drying.

The prepared photoresist solution can be applied to a substrate by any conventional method used in the photoresist art, including dipping, spraying, whirling and spin coating. When spin coating, for example, the photoresist solution can be adjusted with respect to the percentage of solids content, in order to provide a coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also be coated with an antireflective coating to prevent reflections from a reflective substrate.

The photoresist composition solution is then coated onto the substrate, and the substrate is heat treated. This temperature treatment is selected in order to reduce the concentration of residual solvents in the photoresist, while not causing substantial thermal degradation of the photosensitive component. In general, one desires to minimize the concentration of solvents and this first temperature treatment is conducted until substantially all of the solvents have evaporated and a thin coating of photoresist composition, on the order of one micron in thickness, remains on the substrate. The heat treatment is conducted until the rate of change of solvent removal becomes relatively insignificant. The temperature and time selection depends on the photoresist properties desired by the user, as well as the equipment used and commercially desired coating times. The coated substrate can then be exposed to actinic radiation, in any desired pattern, produced by use of suitable masks, negatives, stencils, templates, etc. The photoresist is then subjected to a post exposure second baking or heat treatment, before development.

The exposed negative-acting photoresist-coated substrates are developed to remove the unexposed areas, normally by immersion in an alkaline developing solution or developed by a spray development process. The solution is preferably agitated, for example, by nitrogen burst agitation. The substrates are allowed to remain in the developer until all, or substantially all, of the photoresist coating has dissolved from the unexposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. The photoresist compositions of the present invention are resistant to acid-base etching solutions and to dry etching, and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

EXAMPLES

Example 1

0.988 g of poly[5-(2-trifluoromethyl-1,1,1-trifluoro-2-hydroxypropyl)-2-norbornene] (Mw 8,300, Mn/Mw=1.69), 0.247 g of tetramethoxyglycoluril, 0.013 g of triphenylsulfonium triflate, 0.122 g of 1 wt % propyleneglycol monomethylether acetate (PGMEA) solution of tetrabutylammonium hydroxide and 0.012 g of 10 wt % PGMEA solution of a surfactant FC 4430 (fluoroaliphatic polymeric ester, supplied by 3M Corporation, St. Paul Minn.) were dissolved in 8.62 g of PGMEA to give a photoresist solution. The solution was filtered using 0.2 $\mu$m filter and processed as follows. Separately, a bottom antireflective coated (B.A.R.C) silicon substrate was prepared by spin coating the bottom anti-reflective coating solution AZ® EXP ArF-1C (available from Clariant Corp., Somerville, N.J.) on to the silicon substrate and baked at 175° C. for 60 seconds. The B.A.R.C film thickness was kept to 39 nm. The photoresist solution was then coated on the B.A.R.C coated silicon substrate. The spin speed was adjusted such that the photoresist film thickness was 330 nm. The resist film was baked at 95° C. for 60 sec. It was then exposed on a 193 nm ISI ministepper (numerical aperture of 0.6 and coherence of 0.7) using a chrome on quartz binary mask. After exposure, the wafer was post-exposure baked at 150° C. for 60 sec. Developing was carried out using 2.38 wt % aqueous solution of tetramethyl ammonium hydroxide for 60 sec. The line and space patterns were then observed on a scanning electron microscope. The photoresist had a sensitivity of 58 mJ/cm$^2$ and a linear resolution of 0.18 $\mu$m.

Example 2

0.892 g of poly[5-(2-trifluoromethyl-1,1,1-trifluoro-2-hydroxypropyl)-2-norbornene] (Mw 8,300, Mn/Mw=1.69), 0.223 g of tetramethoxyglycoluril, 0.023 g of triphenylsulfonium triflate, 0.217 g of 1 wt % PGMEA solution of tetrabutylammonium hydroxide and 0.011 g of 10 wt % PGMEA solution of FC 4430 were dissolved in 7.75 g of PGMEA. The solution was filtered using a 0.2 μm filter and processed in a similar manner to that described in Example 1 except the resist film was baked at 110° C. for 60 sec, post-exposure baked at 150° C. for 60 sec and development was carried for 120 sec.

The formulation had a sensitivity of 26 mJ/cm² and a linear resolution of 0.13 μm.

Example 3

0.979 g of poly[5-(2-trifluoromethyl-1,1,1-trifluoro-2-hydroxypropyl)-2-norbornene] (Mw 8,730, Mn/Mw=1.84), 0.245 g of tetramethoxyglycoluril, 0.0252 g of triphenylsulfonium triflate, 0.137 g of 1 wt % PGMEA solution of triethanolamine and 0.012 g of 10 wt % PGMEA solution of FC 4430 were dissolved in 8.60 g of PGMEA. The solution was filtered using a 0.2 μm filter and processed in a similar manner to that described in Example 1 except the photoresist film was baked at 115° C. for 60 sec, post-exposure baked at 130° C. for 60 sec and developed was carried for 60 sec.

The formulation had a sensitivity of 20 mJ/cm² and a linear resolution of 0.08 μm.

Example 4

1.982 g of poly[5-(2-trifluoromethyl-1,1,1-trifluoro-2-hydroxypropyl)-2-norbornene] (Mw 8,300, Mn/Mw=1.69), 0.0668 g of tetramethyl-1,3-benzenedimethanol, 0.178 g of triphenylsulfonium nonaflate and 0.012 g of 10 wt % PGMEA solution of FC4430 were dissolved in 18 g of PGMEA. The solution was filtered using 0.2 μm filter and processed in a similar manner to that described in Example 1 except the resist film was baked at 90° C. for 60 sec, post-exposure baked at 110° C. for 60 sec and development was carried for 60 sec.

The formulation had a sensitivity of 15 mJ/cm² and a linear resolution of 0.20 μm.

What is claimed is:

1. A negative photoresist composition comprising:
   a) an alkali soluble polymer consisting of unit of structure 1,

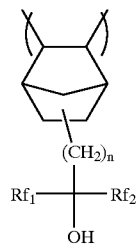

where $Rf_1$ and $Rf_2$ are independently a perfluorinated or partially fluorinated alkyl group; and, n is 1–8, b) a single or mixture of photoacid generators; and,
   c) a crosslinking agent.

2. The photoresist composition according to claim 1, where the polymer is poly[5-(2-trifluoromethyl-1,1,1-trifluoro-2-hydroxypropyl)-2-norbornene].

3. The photoresist composition according to claim 1, where in the polymer, n is 1.

4. The photoresist composition according to claim 1, further comprising a base.

5. The photoresist composition according claim 4, where the base is selected from tetrabutylammonium hydroxide, triethanolamine, diethanol amine, trioctylamine, n-octylamine, trimethylsulfonium hydroxide, triphenylsulfonium hydroxide, bis(t-butylphenyl)iodonium cyclamate and tris (tert-butylphenyl)sulfonium cyclamate.

6. A process for imaging a negative photoresist comprising the steps of:
   a) forming on a substrate a photoresist coating from the photoresist composition of claim 1;
   b) image-wise exposing the photoresist coating;
   c) postexposure baking the photoresist coating; and
   d) developing the photoresist coating with an aqueous alkaline solution.

7. The process of claim 6, where the image-wise exposure wavelength is below 200 nm.

8. The process according to claim 6 where the aqueous alkaline solution comprises tetramethylammonium hydroxide.

9. The process according to claim 6 where the aqueous alkaline solution further comprises a surfactant.

* * * * *